US00RE45124E

(19) United States
(12) Reissued Patent
Heys et al.

(10) Patent Number: US RE45,124 E
(45) Date of Reissued Patent: Sep. 9, 2014

(54) METHODS OF ATOMIC LAYER DEPOSITION USING TITANIUM-BASED PRECURSORS

(71) Applicants: Peter Nicholas Heys, Crewe (GB); Andrew Kingsley, Newton (GB); Fuquan Song, Eastham (GB); Paul Williams, Wirral (GB); Thomas Leese, Alsager (GB); Hywel Owen Davies, Mold (GB); Rajesh Odedra, Altrincham (GB)

(72) Inventors: Peter Nicholas Heys, Crewe (GB); Andrew Kingsley, Newton (GB); Fuquan Song, Eastham (GB); Paul Williams, Wirral (GB); Thomas Leese, Alsager (GB); Hywel Owen Davies, Mold (GB); Rajesh Odedra, Altrincham (GB)

(73) Assignee: Sigma-Aldrich Co. LLC, St. Louis, MO (US)

(21) Appl. No.: 13/842,164

(22) Filed: Mar. 15, 2013

Related U.S. Patent Documents

Reissue of:
(64) Patent No.: 8,221,852
Issued: Jul. 17, 2012
Appl. No.: 12/207,973
Filed: Sep. 10, 2008

U.S. Applications:
(60) Provisional application No. 60/972,488, filed on Sep. 14, 2007.

(51) Int. Cl.
*H05H 1/24* (2006.01)
*C23C 16/00* (2006.01)
*C23C 8/00* (2006.01)

(52) U.S. Cl.
USPC ..... 427/569; 427/585; 427/248.1

(58) Field of Classification Search
USPC ..... 427/569, 585, 248.1
See application file for complete search history.

(56) References Cited

U.S. PATENT DOCUMENTS 4,581,249 A 4/1986 Kamiya ..... 427/53.1
5,393,564 A 2/1995 Westmoreland et al. .. 427/248.1

(Continued)

FOREIGN PATENT DOCUMENTS

JP 02-167334 6/1990 ..... C08G 61/08
JP 03-109405 9/1991 ..... C08F 12/14

(Continued)

OTHER PUBLICATIONS

An., J., et al. (2005), "Piano stool complexes containing the bulky pentaphenylcyclopentadienyl ($C_5Ph_5$) ligand: preparation, characterization and X-ray structure of $C_5Ph_5Zr(N(CH_3)_2)_3$ (I)", *Journal of Organometallic Chemistry*, 690: 4376-4380.

(Continued)

*Primary Examiner* — Kelly M Gambetta
(74) *Attorney, Agent, or Firm* — Harness, Dickey & Pierce, P.L.C.

(57) ABSTRACT

Methods of forming titanium-containing films by atomic layer deposition are provided. The methods comprise delivering at least one precursor to a substrate, wherein the at least one precursor corresponds in structure to Formula I:

(Formula I)

wherein:
R is $C_1$-$C_6$-alkyl;
n is zero, 1, 2, 3, 4 or 5;
L is $C_1$-$C_6$-alkoxy or amino, wherein the amino is optionally independently substituted 1 or 2 times with $C_1$-$C_6$-alkyl.

31 Claims, 19 Drawing Sheets

(56) References Cited

U.S. PATENT DOCUMENTS

| | | | | |
|---|---|---|---|---|
| 5,625,086 | A | 4/1997 | Lisowsky | 556/54 |
| 6,015,590 | A | 1/2000 | Suntola et al. | 427/255.23 |
| 6,203,613 | B1 | 3/2001 | Gates et al. | 117/104 |
| 6,698,728 | B1 | 3/2004 | Ravetz et al. | 261/121.1 |
| 7,091,129 | B2 | 8/2006 | Chau | 438/707 |
| 7,282,119 | B2 | 10/2007 | Odedra et al. | 203/29 |
| 7,419,698 | B2 | 9/2008 | Jones | 427/248.1 |
| 7,476,420 | B2 | 1/2009 | Skarp et al. | 427/255.29 |
| 7,927,661 | B2 | 4/2011 | Jones | 427/255.31 |
| 8,039,062 | B2 | 10/2011 | Heys et al. | 427/585 |
| 2004/0092096 | A1 | 5/2004 | Raaijmakers et al. | 438/627 |
| 2007/0122947 | A1 | 5/2007 | Sakurai | 438/148 |
| 2008/0213940 | A1 | 9/2008 | Lee et al. | 438/104 |
| 2008/0274615 | A1 | 11/2008 | Vaartstra | 438/685 |
| 2008/0282970 | A1 | 11/2008 | Heys et al. | 117/104 |
| 2009/0074983 | A1 | 3/2009 | Heys et al. | 427/569 |
| 2009/0081385 | A1 | 3/2009 | Heys et al. | 427/585 |
| 2010/0256406 | A1 | 10/2010 | Kanjolia et al. | 556/136 |
| 2010/0261350 | A1 | 10/2010 | Kanjolia et al. | 438/681 |
| 2011/0021803 | A1 | 1/2011 | Jin et al. | 558/150 |
| 2011/0151227 | A1 | 6/2011 | Chalker et al. | 428/220 |
| 2011/0165401 | A1 | 7/2011 | Chalker et al. | 428/220 |
| 2011/0165780 | A1 | 7/2011 | Kanjolia et al. | 438/785 |
| 2011/0184156 | A1 | 7/2011 | Jones | 534/15 |
| 2012/0177845 | A1 | 7/2012 | Odedra et al. | 427/569 |
| 2012/0178266 | A1 | 7/2012 | Heys et al. | 438/785 |
| 2013/0041170 | A1 | 2/2013 | Odedra et al. | 556/46 |
| 2013/0052368 | A1 | 2/2013 | Rushworth et al. | 427/569 |
| 2013/0196065 | A1 | 8/2013 | Heys et al. | |

FOREIGN PATENT DOCUMENTS

| | | | |
|---|---|---|---|
| JP | 2005-171291 | 6/2005 | C23C 16/34 |
| JP | 2005/171291 | 5/2006 | |
| JP | 2006-165537 | 6/2006 | H01L 21/316 |
| JP | 2009-539237 | 11/2009 | H01L 21/312 |
| JP | 2010-506378 | 2/2010 | H01L 21/314 |
| KR | 20080101040 | 11/2008 | |
| KR | 102008010104 | 11/2008 | C23C 16/18 |
| TW | 200540291 | 12/2005 | C23C 16/34 |
| WO | WO 2004/017377 | 2/2004 | |
| WO | WO 2006/131751 | 12/2006 | C23C 16/18 |
| WO | WO 2007/066546 | 6/2007 | C07F 7/00 |
| WO | WO 2007/140813 | 12/2007 | C23C 16/18 |
| WO | WO 2007/141059 | 12/2007 | C23C 16/18 |
| WO | WO 2009/036045 | 3/2009 | C23C 16/455 |
| WO | WO 2009/036046 | 3/2009 | C23C 16/455 |
| WO | WO 2009/106433 | 9/2009 | C07F 17/00 |
| WO | WO 2009/117583 | 9/2009 | C07F 9/09 |
| WO | WO 2009/143452 | 11/2009 | C23C 16/40 |
| WO | WO 2009/143458 | 11/2009 | C23C 16/40 |
| WO | WO 2009/155507 | 12/2009 | C23C 16/18 |
| WO | WO 2009/155520 | 12/2009 | C23C 16/18 |
| WO | WO 2012/027575 | 3/2012 | C07F 11/00 |
| WO | WO 2013/112383 | 8/2013 | |

OTHER PUBLICATIONS

Cho,Y., et al. (2003), "Atomic Layer Deposition (ALD) of bismuth titanium oxide thin films using direct liquid injection (DLI) method", *Integrated Ferroelectrics*, 59(1): 1483-1489.

George, S.M., et al. (1996), "Surface Chemistry for Atomic Layer Growth", *J. Phys. Chem.*, 100: 13121-13131.

Jones, A., et al. (2006), "MOCVD and ALD of high-k Dielectric Oxides Using Alkoxide Precursors", *Chemical Vapor Deposition*, 12: 83-98.

Niinisto, et. al. ALD of ZrO2 Thin Films Exploiting Novel Mixed Alkylamido-Cyclopentadienyl Precursors. E-MRS Fall Meeting 2007. Oral Presentation. Sep. 18, 2007. Warsaw, Poland.

Potter, R., et al. (2005), "Deposition of $HfO_2$, $Gd_2O_3$ and $PrO_x$ by liquid injection ALD techniques", *Chemical Vapor Deposition*, 11(3): 159-169.

Watanabe, T., et al. (2006), "Liquid-injection atomic layer deposition of $TiO_x$ and Pb-Ti-0 films", *Journal of the Electrochemical Society*, 153(9): F199-F204.

Wright, P.J., et al. (2002), "Metal Organic Chemical Vapor Deposition (MOCVD) of oxides and ferroelectric materials", *Journal of Materials Science: Materials in Electronics*, 13: 671-678.

Wu, Q., et al. (2006), "Diphenyl substituted Cyclopentadienyl titanium trichloride derivatives: synthesis, crystal structure and properties as catalysts for styrene polymerization", *Polyhedron*, 25: 2565-2570.

International Search Report issued in PCT Application No. PCT/US2008/075831 dated Jan. 14, 2009.

International Search Report issued in PCT Application No. PCT/US2008/075830 dated Feb. 11, 2009.

International Preliminary Report on Patentability issued in PCT Application No. PCT/US2008/075831 dated Mar. 16, 2010.

International Preliminary Report on Patentability issued in PCT Application No. PCT/US2008/075830 dated Mar. 16, 2010.

Office Action dated Oct. 18, 2011 issued in Chinese Application No. 200880106859.3 with English Translation.

Office Action dated Apr. 8, 2011 issued in Chinese Application No. 200880106859.3 with English Translation.

Office Action dated May 4, 2011 issued in Chinese Application No. 200880106796.1 with English Translation.

Office Action dated Apr. 19, 2012 issued in Chinese Application No. 200880106796.1 with English Translation.

Office Action dated Apr. 1, 2011 issued in European Application No. 08799401.8.

Office Action dated Jun. 25, 2012 issued in Japanese Application No. 2010-524955 with English Translation.

Office Action dated Feb. 4, 2013 issued in Japanese Application No. 2010-524955 with English Translation.

Office Action dated Jun. 25, 2012 issued in Japanese Application No. 2010-524954 with English Translation.

Office Action dated Feb. 4, 2013 issued in Japanese Application No. 2010-524954 with English Translation.

Office Action dated Nov. 15, 2010 issued in U.S. Appl. No. 12/207,968.

Office Action dated Nov. 17, 2010 issued in U.S. Appl. No. 12/207,973.

Office Action dated Mar. 25, 2011 issued in U.S. Appl. No. 12/207,973.

Office Action dated Aug. 12, 2011 issued in U.S. Appl. No. 12/207,973.

Office Action dated Oct. 7, 2013 issued in Taiwan Application No. 097134791.

Office Action dated Oct. 11, 2013 issued in Taiwan Application No. 097134790.

George, S.M., et. al. Surface Chemistry for Atomic Layer Growth. J. Phys. Chem. 100: 13121-13131 (1996).

Potter, R.J., et. et. Deposition of IIfO2, Gd2O3 and PrOx by Liquid Injection ALD Techniques. Chem. Vap. Deposition 11: 159-169 (2005).

Wu, et. al. Diphenyl substituted cyclopentadienyl titanium trichloride derivatives: Synthesis, crystal structure and properties as catalysts for styrene polymerzation. Polyhedron 25: 2565-2570 (2006).

An, J., et. al. Piano stool complexes containing the bulky pentaphenylcyclopentadienyl (C5Ph5) ligand: Preparation, characterization and X-ray structure of C5Ph5Zr(N(CH3)2)3 (I). Journal of Organometallic Chemistry 690: 4376-4380 (2005).

Jones, A.C., et. al. MOCVD and ALD of High-K Dielectric Oxides Using Alkoxide Precursors. Chem. Vap. Depostion 12: 83-98 (2006).

International Search Report for PCT/US2008/075830 dated Feb. 11, 2009.

Rushworth S., et. al. Thermal Stability Studies for Advanced Hafnium and Zirconium ALD Precursors, Surface & Coating Technology, 201 (2007) 9060-9065.

International Search Report for PCT/US2008/075831 dated Jan. 14, 2009.

Office Action dated Nov. 15, 2010 in U.S. Appl. No. 12/207,968.

Wright, P.J., et al. (2002) "Metal Organic Chemical Vapor Deposition (MOCVD) of Oxides and Ferroelectric Materials" Journal of Materials Science: Materials in Electronics 13:671-678.

| Precursor | Vapour pressure Equation |
|---|---|
| MeCpTi(OiPr)3 | Log10P(mTorr) = -2571.9/T(Kelvin) + 10.336 |
| MeCpTi(NMe2)3 | Log10P(mTorr) = -3158.4/T(Kelvin) + 12.21 |

| Precursor | Viscometer | Constant | Temp °C | Density ($g/cm^{-2}$) | Time | Viscosity (cSt) | Viscosity (Centripoids) |
|---|---|---|---|---|---|---|---|
| $(MeCp)Ti(OiPr)_3$ | 150 | 0.03699 | 19 | 0.955 | 77.89 | 2.8811511 | 2.7514993 |
| $(MeCp)Ti(NMe_2)_3$ | 150 | 0.03699 | 19 | 0.975 | 310.08 | 11.4698592 | 11.183113 |

METHODS OF ATOMIC LAYER DEPOSITION USING TITANIUM-BASED PRECURSORS

Matter enclosed in heavy brackets [ ] appears in the original patent but forms no part of this reissue specification; matter printed in italics indicates the additions made by reissue.

CROSS-REFERENCED APPLICATIONS

This application claims priority to U.S. provisional application Ser. No. 60/972,488 filed on Sep. 14, 2007, the disclosure of which is incorporated by reference in its entirety. Disclosure of copending U.S. provisional application Ser. No. 60/972,451 filed on Sep. 14, 2007, is incorporated herein by reference in its entirety without admission that such disclosure constitutes prior art to the present invention.

FIELD OF THE INVENTION

The present invention relates to methods of preparing thin films by atomic layer deposition (ALD) using titanium-based precursors.

BACKGROUND OF THE INVENTION

ALD is a known method for the deposition of thin films. It is a self-limiting, sequential unique film growth technique based on surface reactions that can provide atomic layer control and deposit conformal thin films of materials provided by precursors onto substrates of varying compositions. In ALD, the precursors are separated during the reaction. The first precursor is passed over the substrate producing a monolayer on the substrate. Any excess unreacted precursor is pumped out of the reaction chamber. A second precursor is then passed over the substrate and reacts with the first precursor, forming a monolayer of film on the substrate surface. This cycle is repeated to create a film of desired thickness.

ALD processes have applications in nanotechnology and fabrication of semiconductor devices such as capacitor electrodes, gate electrodes, adhesive diffusion barriers and integrated circuits. Further, dielectric thin films having high dielectric constants (permittivities) are necessary in many sub-areas of microelectronics and optelectronics. The continual decrease in the size of microelectronics components has increased the need for the use of such dielectric films.

Japanese Patent Application No. P2005-171291 reports titanium-based precursors for use in chemical vapor deposition.

Current precursors for use in ALD do not provide the required performance to implement new processes for fabrication of next generation devices, such as semi-conductors. For example, improved thermal stability, higher volatility or increased deposition rates are needed.

SUMMARY OF THE INVENTION

There are now provided methods of forming a titanium-containing film by atomic layer deposition. The methods comprise delivering at least one precursor to a substrate, wherein the at least one precursor corresponds in structure to Formula I:

(Formula I)

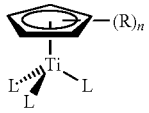

wherein:

R is $C_1$-$C_6$-alkyl;

n is zero, 1, 2, 3, 4 or 5;

L is $C_1$-$C_6$-alkoxy or amino, wherein the amino is optionally independently substituted 1 or 2 times with $C_1$-$C_6$-alkyl.

Other embodiments, including particular aspects of the embodiments summarized above, will be evident from the detailed description that follows.

DETAILED DESCRIPTION OF THE INVENTION

Figure 1:
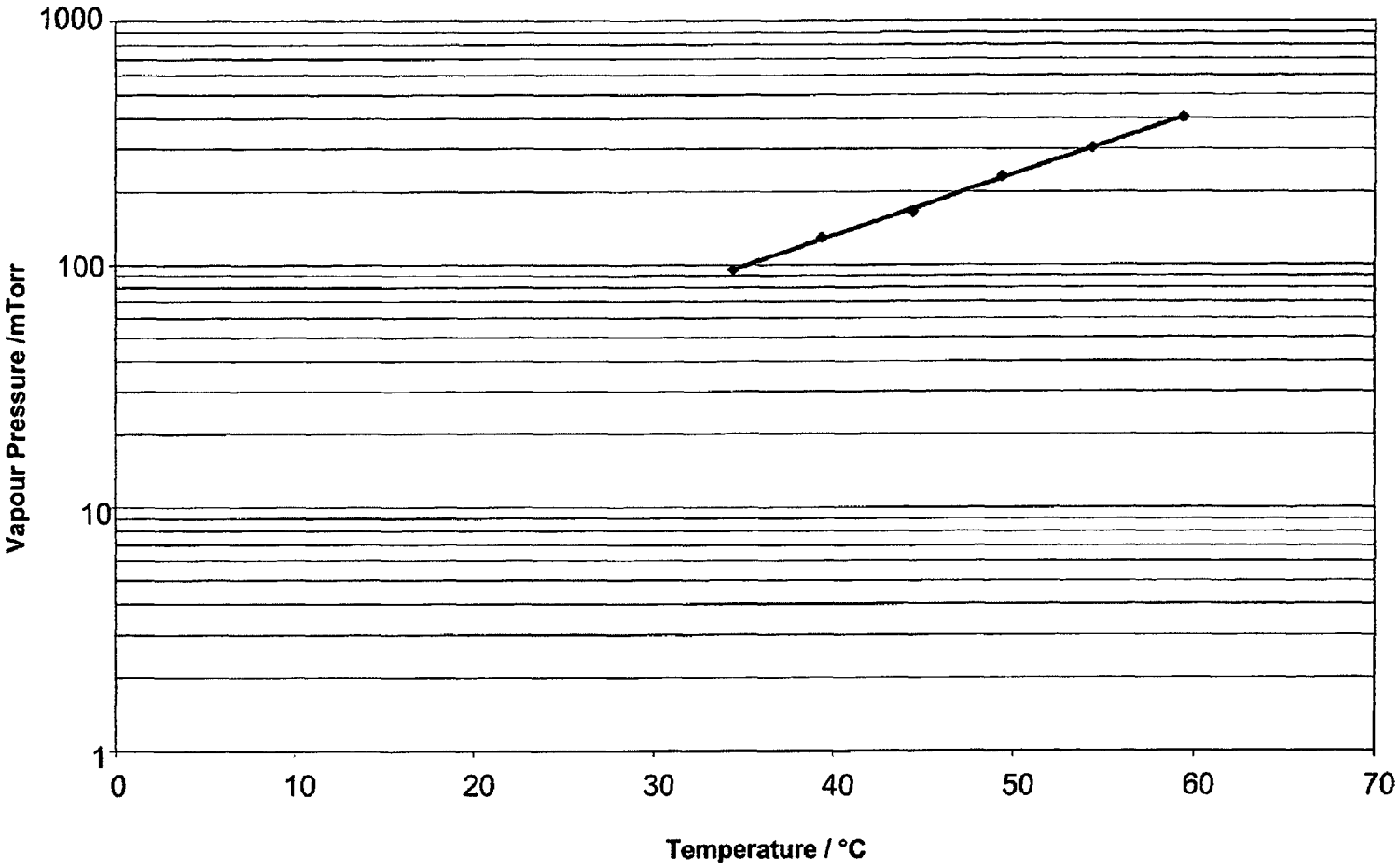
FIG. 1 is a graphical representation of a vapor pressure curve of $(MeCp)Ti(OiPr)_3$.

In various aspects of the invention, methods are provided which utilize titanium-based precursors to form titanium-containing films by ALD.

The methods of the invention are used to create or grow titanium-containing thin films which display high dielectric constants. A dielectric thin film as used herein refers to a thin film having a high permittivity. The films created herein by ALD are dielectric thin films.

A. Definitions

As used herein, the term "precursor" refers to an organometallic molecule, complex and/or compound which is delivered to a substrate for deposition to form a thin film by ALD.

The organometallic precursor of the invention has at least one metallic center comprising a transition metal ("M"). In particular, there is one metal center and M is Ti.

The term "Cp" refers to a cyclopentadienyl ($C_5H_5$) ligand which is bound to a transition metal. As used herein, all five carbon atoms of the Cp ligand are bound to the metal center in $\eta^5$-coordination by $\pi$ bonding, therefore the precursors of the invention are $\pi$ complexes.

The term "alkyl" refers to a saturated hydrocarbon chain of 1 to about 6 carbon atoms in length, such as, but not limited to, methyl, ethyl, propyl and butyl. The alkyl group may be straight-chain or branched-chain. For example, as used herein, propyl encompasses both n-propyl and iso-propyl; butyl encompasses n-butyl, sec-butyl, iso-butyl and tert-butyl. Further, as used herein, "Me" refers to methyl, "Et" refers to ethyl, "iPr" refers to iso-propyl and "tBu" refers to tert-butyl.

The term "amino" herein refers to an optionally substituted monovalent nitrogen atom (i.e., —$NR^1R^2$, where $R^1$ and $R^2$ can be the same or different). Examples of amino groups encompassed by the invention include but are not limited to

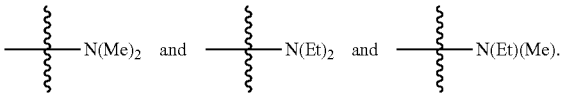

Further, the nitrogen atom of this amino group is covalently bonded to the metal center which together may be referred to as an "amide" group (i.e.

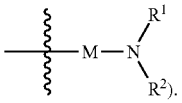

This can be further referred to as an "ammono" group or inorganic amide, for example

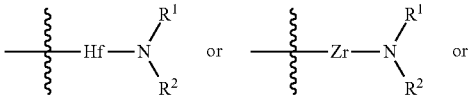

-continued

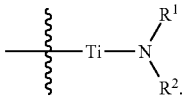

B. Methods of Use

In a first embodiment, a method of forming a titanium-containing film by atomic layer deposition is provided. The method comprises delivering at least one precursor to a substrate, wherein the at least one precursor corresponds in structure to Formula I:

(Formula I)

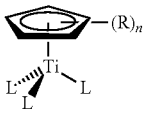

wherein:

R is $C_1$-$C_6$-alkyl;

n is zero, 1, 2, 3, 4 or 5;

L is $C_1$-$C_6$-alkoxy or amino, wherein the amino is optionally independently substituted 1 or 2 times with $C_1$-$C_6$-alkyl.

In one embodiment, the at least one precursor corresponds in structure to Formula I, wherein R is methyl, ethyl or propyl;

n is zero, 1 or 2; and

L is selected from the group consisting of methoxy, ethoxy, propoxy, butoxy, dimethylamino, ethylmethylamino, and diethylamino.

In one embodiment, the at least one precursor corresponds in structure to Formula I, wherein R is methyl or ethyl;

n is 1 or 2; and

L is selected from the group consisting of methoxy, ethoxy, propoxy, butoxy, dimethylamino, ethylmethylamino, and diethylamino.

In one embodiment, the at least one precursor corresponds in structure to Formula I, wherein R is methyl or ethyl;

n is 1 or 2; and

L is selected from the group consisting of methoxy, ethoxy, propoxy, and butoxy.

In one embodiment, the at least one precursor corresponds in structure to Formula I, wherein R is methyl or ethyl;

n is 1; and

L is selected from the group consisting of methoxy, ethoxy, propoxy and butoxy.

In one embodiment, the at least one precursor corresponds in structure to Formula I, wherein R is methyl or ethyl;

n is 1 or 2; and

L is selected from the group consisting of dimethylamino, ethylmethylamino, and diethylamino.

In another embodiment, a method of forming a titanium-containing film by atomic layer deposition is provided, wherein the method comprises delivering at least one precursor to a substrate, wherein the at least one precursor corresponds in structure to Formula II:

(Formula II)

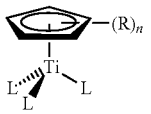

wherein:
R is $C_1$-$C_6$-alkyl;
n is zero, 1, 2, 3, 4 or 5;
L is $C_1$-$C_6$-alkoxy.

In one embodiment, the at least one precursor corresponds in structure to Formula II wherein
R is methyl, ethyl or propyl;
n is zero, 1 or 2; and
L is selected from the group consisting of methoxy, ethoxy, propoxy and butoxy.

In one embodiment, the at least one precursor corresponds in structure to Formula II wherein
R is methyl or ethyl;
n is 1 or 2; and
L is selected from the group consisting of methoxy, ethoxy, propoxy and butoxy.

In one embodiment, the at least one precursor corresponds in structure to Formula II wherein
R is methyl or ethyl;
n is 1; and
L is selected from the group consisting of methoxy, ethoxy, propoxy, and butoxy.

In another embodiment, a method of forming a titanium-containing film by atomic layer deposition is provided, wherein the method comprises delivering at least one precursor to a substrate, wherein the at least one precursor corresponds in structure to Formula III:

(Formula III)

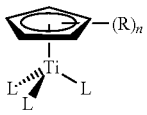

wherein:
R is $C_1$-$C_6$-alkyl;
n is zero, 1, 2, 3, 4 or 5;
L is amino, wherein the amino is optionally independently substituted 1 or 2 times with $C_1$-$C_6$-alkyl.

In one embodiment, the at least one precursor corresponds in structure to Formula III, wherein
R is $C_1$-$C_6$-alkyl;
n is zero, 1 or 2;
L is amino, wherein the amino is optionally substituted 1 or 2 times with $C_1$-$C_6$-alkyl.

In another embodiment, the at least one precursor corresponds in structure to Formula III, wherein
R is $C_1$-$C_6$-alkyl;
n is 3, 4 or 5;
L is amino, wherein the amino is optionally substituted 1 or 2 times with $C_1$-$C_6$-alkyl.

In one embodiment, the at least one precursor corresponds in structure to Formula I, II or III, wherein butyl is selected from the group consisting of n-butyl, sec-butyl, iso-butyl and tert-butyl. In a particular embodiment, butyl is tert-butyl.

In one embodiment, the at least one precursor corresponds in structure to Formula I, II or III, wherein propyl is selected from the group consisting of n-propyl and iso-propyl. In a particular embodiment, propyl is iso-propyl.

In one embodiment, the at least one precursor corresponding in structure to Formula I, II or III is selected from the group consisting of:

(methylcyclopentadienyl)Ti($NMe_2$)$_3$;
(ethylcyclopentadienyl)Ti($NMe_2$)$_3$;
(propylcyclopentadienyl)Ti($NMe_2$)$_3$;
(methylcyclopentadienyl)Ti($NEt_2$)$_3$;
(ethylcyclopentadienyl)Ti($NEt_2$)$_3$;
(propylcyclopentadienyl)Ti($NEt_2$)$_3$;
(methylcyclopentadienyl)Ti(NMeEt)$_3$;
(ethylcyclopentadienyl)Ti(NMeEt)$_3$;
(propylcyclopentadienyl)Ti(NMeEt)$_3$;
(methylcyclopentadienyl)Ti(OMe)$_3$;
(ethylcyclopentadienyl)Ti(OMe)$_3$;
(propylcyclopentadienyl)Ti(OMe)$_3$;
(methylcyclopentadienyl)Ti(OEt)$_3$;
(ethylcyclopentadienyl)Ti(OEt)$_3$;
(propylcyclopentadienyl)Ti(OEt)$_3$;
(methylcyclopentadienyl)Ti(OiPr)$_3$;
(ethylcyclopentadienyl)Ti(OiPr)$_3$;
(propylcyclopentadienyl)Ti(OiPr)$_3$;
(methylcyclopentadienyl)Ti(OtBu)$_3$;
(ethylcyclopentadienyl)Ti(OtBu)$_3$; and
(propylcyclopentadienyl)Ti(OtBu)$_3$.

In a particular embodiment, the at least one precursor corresponding in structure to Formula I, II or III is selected from the group consisting of:

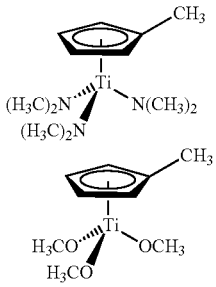

(methylcyclopentadienyl)Ti($NMe_2$)$_3$; (methylcyclopentadienyl)Ti(OMe)$_3$;

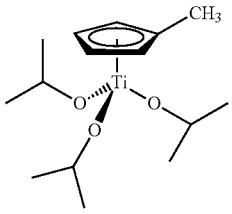

(methylcyclopentadienyl)Ti(OiPr)$_3$; and

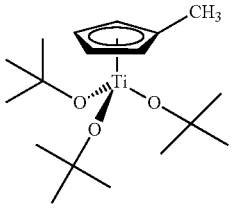

(methylcyclopentadienyl)Ti(OtBu)$_3$.

C. Types of Titanium-Containing Films

The methods of the invention can be used to form a variety of titanium-containing films using at least one organometallic precursor according to Formula I-III. In a particular embodiment, a titanium, titanium oxide or titanium nitride film is formed by ALD.

In a particular embodiment, a titanium oxide film is deposited onto a substrate. The at least one precursor according to Formula I-III may be delivered for deposition to a substrate in pulses alternating with pulses of an appropriate oxygen source, such as $H_2O$, $O_2$ and/or ozone.

In another embodiment, two or more precursors according to Formula I-III can be used to form a titanium-containing film.

In another embodiment a titanium-containing film can be formed by delivering for deposition at least one precursor according to Formula I-III, independently or in combination with a co-reactant. Examples of such co-reactants include, but are not limited to hydrogen, hydrogen plasma, oxygen, air, water, $H_2O_2$, ammonia, hydrazines, allylhydrazines, boranes, silanes, ozone or any combination thereof.

In another embodiment, a method is provided for forming a "mixed" metal film by ALD by delivering for deposition at least one precursor according to Formula I-III and at least one non-titanium precursor. For example, at least one titanium precursor according to Formula I-III and at least one appropriate non-titanium precursor, such as a lead, hafnium, zirconium, strontium and/or barium precursor may be delivered for deposition to a substrate to create a mixed metal film. For example, in a particular embodiment, at least one precursor according to Formula I-III can be used to form a metal titanate film, such as a strontium titanate, barium titanate film or lead zirconate titanate (PZT).

In a particular embodiment, at least one precursor according to Formula I-III can be used to dope a metal oxide film, such as but not limited to a hafnium-containing oxide film, a zirconium-containing oxide film, a lanthanide-containing oxide film or any combination thereof. As used herein, when at least one precursor according to Formula I-III is used to dope a metal oxide film, the titanium may be substitutional or interstitial on the film-forming lattice.

In another particular embodiment, the at least one precursor according to Formula I-III can be used to form a ferroelectric, lead zirconate titanate (PZT) film.

D. Permittivity

A thin film created by a method of the invention can have a permittivity of between 10 and 250, preferably at least 25 to 40 and more preferably at least 40 to 100. Further, an ultra high permittivity can be considered to be a value higher than 100. It is understood by one of ordinary skill in the art that the resulting permittivity of the film depends on a number of factors, such as the metal(s) used for deposition, the thickness of the film created, the parameters and substrate employed during growth and subsequent processing.

In a particular embodiment, the at least one precursor according to Formula I-III can be used to form a metal-titanate film with an ultra high permittivity (high-κ) of over 100.

E. Substrates

A variety of substrates can be used in the methods of the present invention. For example, the precursors according to Formula I-III may be delivered for deposition on substrates such as, but not limited to, silicon, silicon oxide, silicon nitride, tantalum, tantalum nitride, or copper.

F. ALD Types

The ALD methods of the invention encompass various types of ALD processes. For example, in one embodiment conventional ALD is used to form a titanium-containing film of the invention. For conventional and/or pulsed injection ALD process see for example, George S. M., et. al. J. Phys. Chem. 1996. 100:13121-13131.

In another embodiment, liquid injection ALD is used to form a titanium-containing film, wherein a liquid precursor is delivered to the reaction chamber by direct liquid injection as opposed to vapor draw by a bubbler (conventional). For liquid injection ALD process see, for example, Potter R. J., et. al. Chem. Vap. Deposition. 2005. 11(3):159.

In a particular embodiment, at least one precursor corresponding in structure to Formula I is used to form a titanium-containing film by liquid injection ALD.

In a particular embodiment, at least one precursor corresponding in structure to Formula II is used to form a titanium-containing film by liquid injection ALD.

In a particular embodiment, at least one precursor corresponding in structure to Formula III is used to form a titanium-containing film by liquid injection ALD.

Examples of liquid injection ALD growth conditions include, but are not limited to:

(1) Substrate temperature: 160-300° C. on Si(100)
(2) Evaporator temperature: about 175° C.
(3) Reactor pressure: about 5 mbar
(4) Solvent: toluene, or any solvent mentioned above
(5) Solution concentration: about 0.05 M
(6) Injection rate: about 2.5 μl $pulse^{-1}$ (4 pulses $cycle^{-1}$)
(7) Inert gas flow rate: about 200 $cm^3$ $min^{-1}$
(8) Pulse sequence (sec.) (precursor/purge/$H_2O$/purge): will vary according to chamber size.
(9) Number of cycles: will vary according to desired film thickness.

In one embodiment, at least one precursor corresponding in structure to Formula I-III is used to form a titanium-containing film by liquid injection ALD, wherein the at least one precursor corresponding in structure to Formula I-III is dissolved in a solvent prior to delivery to the substrate. In a particular embodiment, the precursor may be dissolved in an appropriate hydrocarbon or amine solvent. Appropriate hydrocarbon solvents include, but are not limited to aliphatic hydrocarbons, such as hexane, heptane and nonane; aromatic hydrocarbons, such as toluene and xylene; aliphatic and cyclic ethers, such as diglyme, triglyme and tetraglyme. Examples of appropriate amine solvents include, without limitation, octylamine and N,N-dimethyldodecylamine. For example, the precursor may be dissolved in toluene to yield a 0.05 to 1M solution.

In another embodiment, at least one precursor corresponding in structure to Formula I-III may be delivered "neat" (undiluted by a carrier gas) to the substrate.

In another embodiment, photo-assisted ALD is used to form a titanium-containing film. For photo-assisted ALD processes see, for example, U.S. Pat. No. 4,581,249.

In a particular embodiment, at least one precursor corresponding in structure to Formula I is used to form a titanium-containing film by photo-assisted ALD.

In a particular embodiment, at least one precursor corresponding in structure to Formula II is used to form a titanium-containing film by photo-assisted ALD.

In a particular embodiment, at least one precursor corresponding in structure to Formula III is used to form a titanium-containing film by photo-assisted ALD.

In another embodiment, both liquid injection and photo-assisted ALD may be used to form a titanium-containing film using at least one precursor corresponding in structure to Formula I-III.

Thus, the organometallic precursors according to Formula I-III utilized in these methods may be liquid, solid, or gaseous. Particularly, the precursors are liquid at ambient temperatures with high vapor pressure for consistent transport of the vapor to the process chamber.

ALD relies substantially on chemical reactivity and not thermal decomposition. Therefore, there are fundamental differences in the characteristics desirable for a suitable precursor. The precursor must be thermally stable at the temperatures employed and should be sufficiently volatile to allow deposition onto the substrate. Further, when depositing a metal oxide or metal nitride film, a fast and complete chemical reaction is necessary between the metal precursor and the oxide or nitride source. However, the reaction should only take place at the substrate surface so as not to damage the underlying structure and by-products, such as carbon and hydrogen, should be removed readily from the surface.

Figures 6, 7:
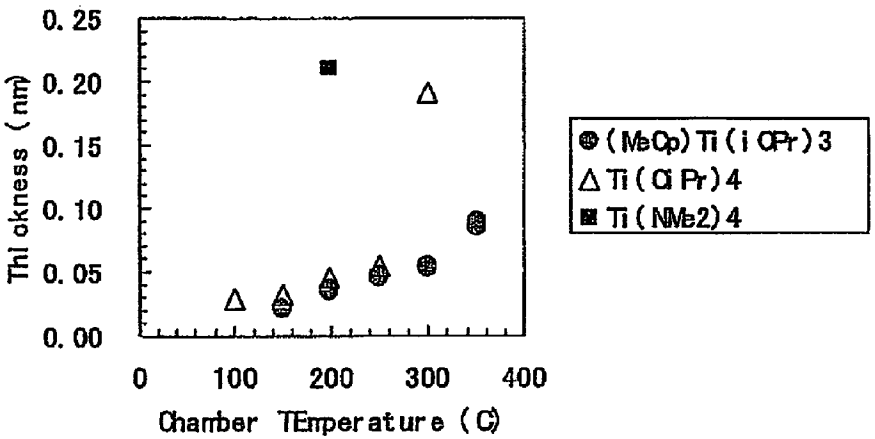
FIG. 6 is a table of viscosity measurements for $(MeCp)Ti(OiPr)_3$ and $(MeCp)Ti(NMe_2)_3$
FIG. 7 is a graphical representation comparing ALD growth data of $(MeCp)Ti(OiPr)_3$ and two standard precursors.

It has been discovered that variation of the substitution of the Cp ring and three identical ligands attached to the metal center demonstrates useful and improved properties for ALD processes. The precursors of Formula I-III provide an increased ability to deposit titanium-containing films, particularly metal oxide films, by ALD at growth rates approaching that for simple metal amides but can operate at higher temperatures due to increased thermal stability which leads to improved product quality. For example, see FIG. 7 comparing ALD of $(MeCp)Ti(OiPr)_3$ to two known ALD precursors. The ALD window of $(MeCp)Ti(OiPr)_3$ is about 280° C., therefore $(MeCp)Ti(OiPr)_3$ demonstrates about 50-80° C. temperature advantage over these two known ALD precursors.

In particular embodiments, the methods of the invention are utilized for applications such as dynamic random access memory (DRAM) and complementary metal oxide semiconductor (CMOS) for memory and logic applications, on substrates such as silicon chips.

EXAMPLES

The following examples are merely illustrative, and do not limit this disclosure in any way. All manipulations were carried out in an inert atmosphere using a glove box and Schlenk line techniques. NMR analysis was carried out using a Bruker 250 MHz machine.

Example 1

Synthesis of $(MeCp)Ti(NMe_2)_3$ $$Ti(NMe_2)_4 + MeCpH \xrightarrow{\text{Hexane}} (MeCp)Ti(NMe_2)_3$$

A Schlenk flask was charged with $Ti(NMe_2)_4$ (22.4 g, 0.1 mole) and anhydrous hexane (50 mls). Freshly cracked MeCpH (7.9 g, 0.1 mole) was then added over 10 minutes to the stirred solution at room temperature. A condenser was fitted and the mixture refluxed for 2 hours and the solvent then removed under reduced pressure. The crude material was distilled at 90° C., 0.001 Torr yielding pure $(MeCp)Ti(NMe_2)_3$ as a dark red solid/liquid in ~90% yield.

NMR ($C_6D_6$): 5.9 (m, 2H, $C_5\underline{H}_4$), 5.75 (m, 2H, $C_5\underline{H}_4$), 3.1 (s, 18H, $N(C\underline{H}_3)_2$), 2.05 (s, 3H, $C\underline{H}_3Cp$)

| C, H, N: | C | H | N |
|---|---|---|---|
| Expected | 55.57 | 9.65 | 16.21 |
| Actual | 58.4 | 9.67 | 15.7 |

Example 2

Synthesis of $(MeCp)Ti(OtBu)_3$ $$(MeCp)Ti(NMe_2)_3 + 3tBuOH \xrightarrow{\text{Hexane}} (MeCp)Ti(OtBu)_3$$

A Schlenk flask was charged with $(MeCp)Ti(NMe_2)_3$ (25.9 g, 0.1 mole) and anhydrous hexane (50 mls). A second Schlenk flask was charged tBuOH (22.2 g, 0.3 mole) and dissolved in anhydrous hexane (20 mls). The anhydrous solutions were then added over 30 minutes to the stirred titanium solution at room temperature and the mixture stirred for 4 hours. The solvent was then removed under reduced pressure. The crude material was distilled at 50° C., 0.001 Torr yielding pure $(MeCp)Ti(OtBu)_3$ as a pale yellow oil in ~90% yield.

NMR ($C_6D_6$): 6.1 (m, 2H, $C_5\underline{H}_4$), 5.95 (m, 2H, $C_5\underline{H}_4$), 2.2 (s, 3H, $C\underline{H}_3Cp$), 1.25 (s, 27H, $C(C\underline{H}_3)_3$.

| C, H, N: | C | H | N |
|---|---|---|---|
| Expected | 62.4 | 9.82 | 0 |
| Actual | 61.8 | 9.78 | 0 |

Example 3

Synthesis of $(MeCp)Ti(OiPr)_3$ $$ClTi(OiPr)_3 + MeCpLi \xrightarrow[\text{ii) Hexane}]{\text{i) } Et_2O} (MeCp)Ti(OiPr)_3$$

A 2 Lt round bottom flask fitted with a mechanical stirrer was charged with nBuLi (62.5 mls of 1.6M solution in hexane, 0.1 moles) and anhydrous diethyl ether (1.0 Lt). The solution was cooled to 0° C. and freshly cracked MeCpH (7.9 g, 0.1 moles) was added over 30 minutes and the suspension then stirred for 2 hours at room temperature. A Schlenk flask was charged with $ClTi(OiPr)_3$ (26.0 g, 0.1 moles) and anhydrous diethyl ether (50 mls). The titanium solution was added to the 2 Lt flask cooled to ~30° C. over 30 minutes, then stirred at room temperature for 12 hours. The solvent was removed under reduced pressure and the product extracted with anhydrous hexane (2×200 mls), filtered and the solvent removed under reduced pressure. The crude product was distilled at 50° C., 0.001 Torr yielding pure $(MeCp)Ti(OiPr)_3$ as an orange oil in ~90% yield.

NMR ($C_6D_6$): 6.05 (m, 2H $C_5\underline{H}_4$), 5.9 (m, 2H, $C_5\underline{H}_4$), 4.5 (septet, 3H, $C\underline{H}Me_2$), 2.2 (s, 3H, $C\underline{H}_3Cp$), 1.15 (d, 18H, $CHC(CH_3)_2$).

| C, H, N: | C | H | N |
|---|---|---|---|
| Expected | 59.16 | 9.2 | 0 |
| Actual | 58.0 | 9.3 | 0 |

Example 4

Synthesis of $(MeCp)Ti(OMe)_3$

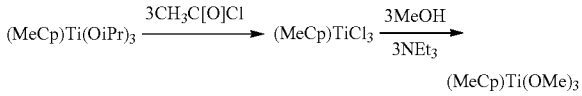

A 2 Lt round bottom flask fitted with a mechanical stirrer was charged with $(MeCp)Ti(OiPr)_3$ (30.4 g, 0.1 mole) and anhydrous diethyl ether (1 Lt). A Schlenk flask was charged with $CH_3C[O]Cl$ (34.0 g, 0.44 moles, ~1.5× excess) and anhydrous diethyl ether (100 mls). The $CH_3C[O]Cl$/anhydrous diethyl ether solution was then added to the titanium solution at room temperature over 1 hour and the solution then refluxed for 12 hours. A Schlenk flask was charged with anhydrous MeOH (11.5 g, 0.36 moles, 1.2 excess), anhydrous $NEt_3$ (36.3 g, 0.36 moles, 1.2 excess) and anhydrous diethyl ether (200 mls). The MeOH/anhydrous $Net_3$/anhydrous diethyl ether solution was added to the titanium solution cooled to −10° C. over 60 minutes and the thick suspension stirred at room temperature for 3 hours. The solvent was removed under reduced pressure and the product extracted with anhydrous hexane (2×300 mls), filtered and the solvent removed under reduced pressure. The crude product was distilled at 50° C., 0.001 Torr yielding pure $(MeCp)Ti(OMe)_3$ as a yellow oil in ~50% yield.

NMR ($C_6D_6$): 5.95 (m, 2H $C_5\underline{H}_4$), 5.8 (m, 2H, $C_5\underline{H}_4$), 3.9 (s, 9H, $OC\underline{H}_3$), 2.0 (s, 3H, $C\underline{H}_3Cp$).

| C, H, N: | C | H | N |
|---|---|---|---|
| Expected | 41.08 | 6.85 | 0 |
| Actual | 51.7 | 7.5 | 0 |

Example 5

$^1H$ NMR Thermal Stability Study

A neat precursor sample was sealed in a NMR tube under nitrogen. The sample was then heated for the required length of time with testing periodically.

Figure 11:
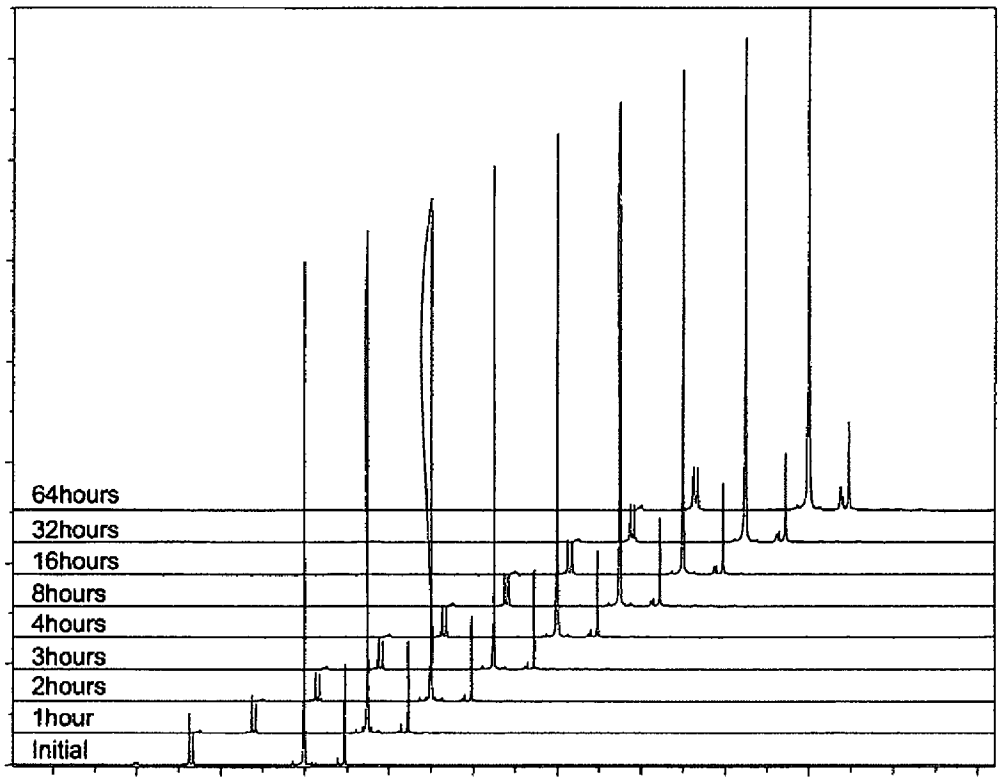
FIG. 11 represents $^1H$ NMR results of $(MeCp)Ti(NMe_2)_3$ at 150° C.

FIG. 11 represents $^1H$ NMR results of $(MeCp)Ti(NMe_2)_3$ at 150° C.

Figure 12:
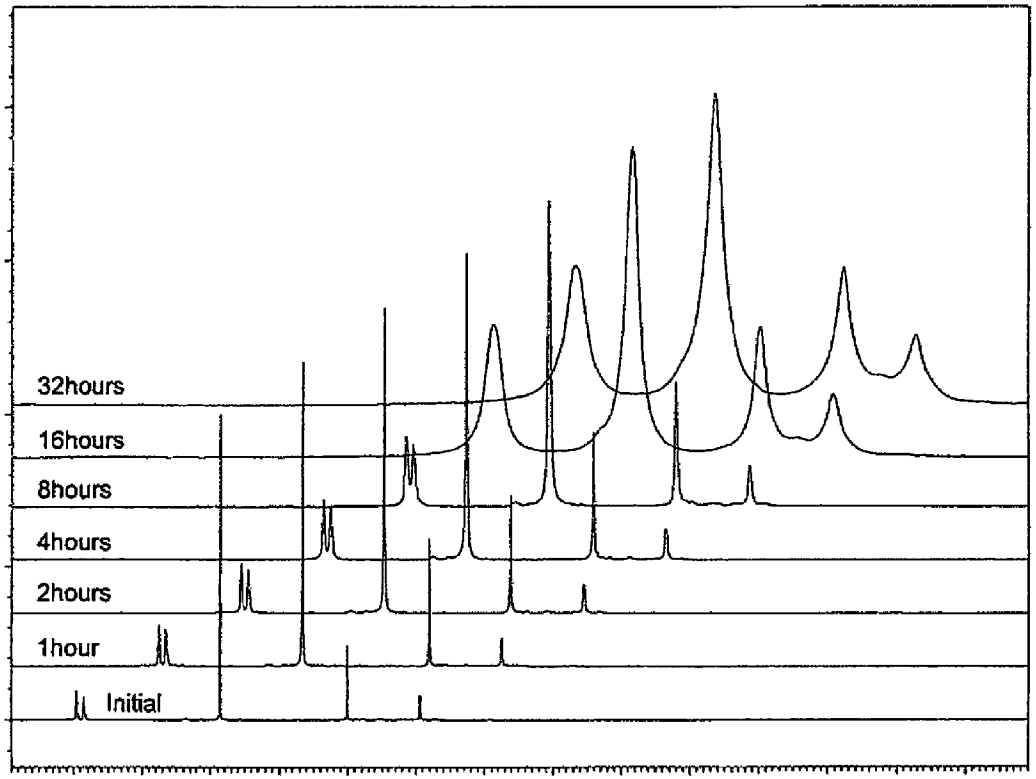
FIG. 12 represents $^1H$ NMR results of $(MeCp)Ti(OMe)_3$ at 150° C.

FIG. 12 represents $^1H$ NMR results of $(MeCp)Ti(OMe)_3$ at 150° C.

The stability of these compounds at high temperatures is clearly sufficient for their use in standard delivery mechanisms used to introduce precursor vapors into deposition chambers for all methods of vapor phase deposition including but not limited to MOCVD (metal organic chemical vapor deposition), MOVPE (metal organic vapor phase epitaxy) and ALD.

Example 6

Vapor Pressure Study

Figure 2:
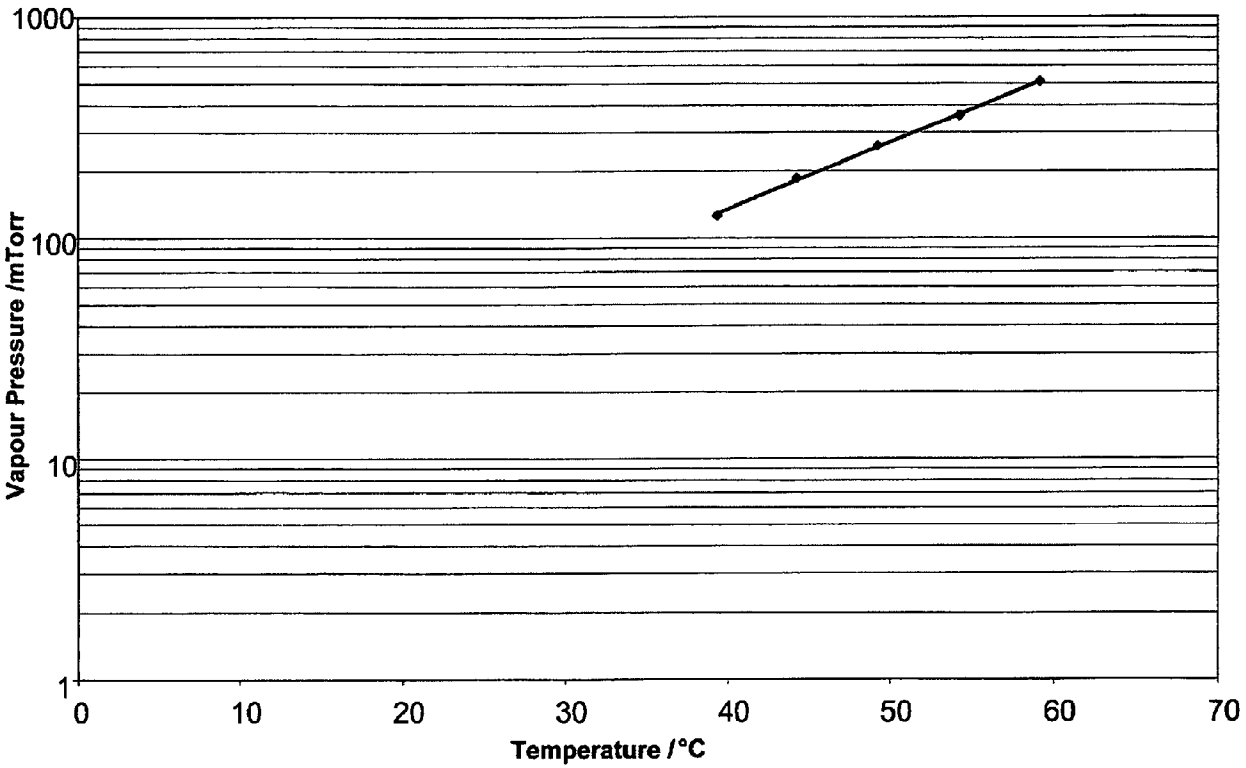
FIG. 2 is a graphical representation of a vapor pressure curve of $(MeCp)Ti(NMe_2)_3$.

FIG. 1 and FIG. 2 demonstrate vapor pressure versus temperature for $(MeCp)Ti(OiPr)_3$ and $(MeCp)Ti(NMe_2)_3$, respectively.

Figures 3, 3A:
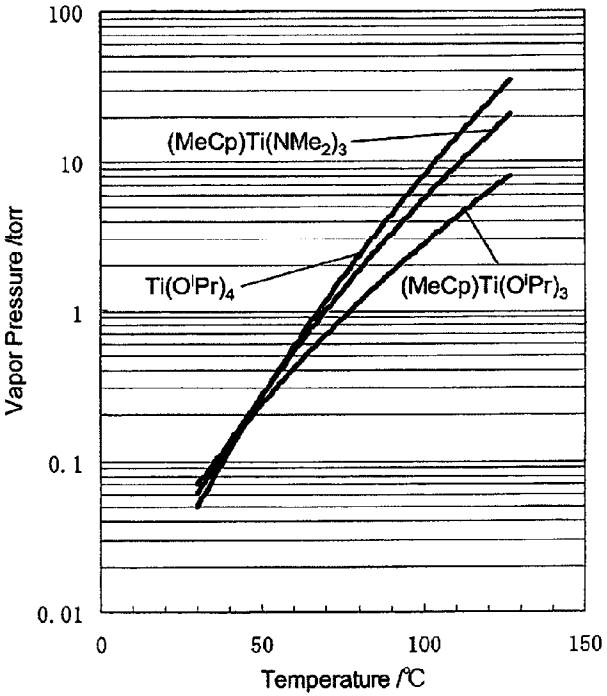
FIG. 3 is a table of vapor pressure equations for $(MeCp)Ti(OiPr)_3$ and $(MeCp)Ti(NMe_2)_3$.
FIG. 3A is a graphical representations of the vapor pressure curves of $(MeCp)Ti(OiPr)_3$, $(MeCp)Ti(NMe_2)_3$ in comparison to $Ti(OiPr)_4$ standard precursor.

FIG. 3 contains the vapor pressure equations for $(MeCp)Ti(OiPr)_3$ and $(MeCp)Ti(NMe_2)_3$.

FIG. 3A represents the vapor pressure curves of the above recited precursors in comparison to $Ti(OiPr)_4$.

The volatility of the precursors in the range suited for desired vapor delivery rates is shown to be very similar to $Ti(OiPr)_4$ a well established titanium precursor hence the new sources are capable of direct substitution in to existing process delivery technologies. The high volatility is a distinct advantage for high volume manufacture to keep thermal budgets to a minimum to save energy and also limit the potential for deleterious pre-reactions and deposits.

Example 7

TGA Data

Figure 4:
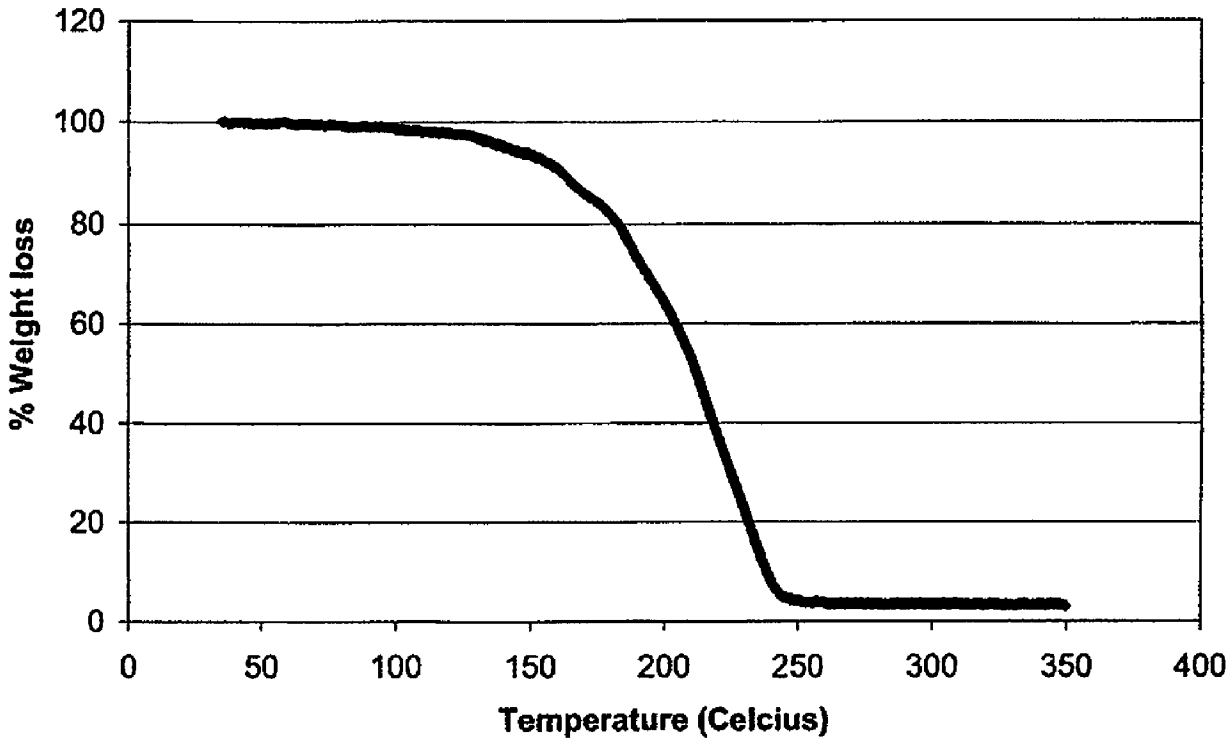
FIG. 4 is a graphical representation of thermogravimetric analysis (TGA) data demonstrating % weight loss vs. temperature of $(MeCp)Ti(OiPr)_3$.

FIG. 4 represents TGA data for $(MeCp)Ti(OiPr)_3$.

Figure 5:
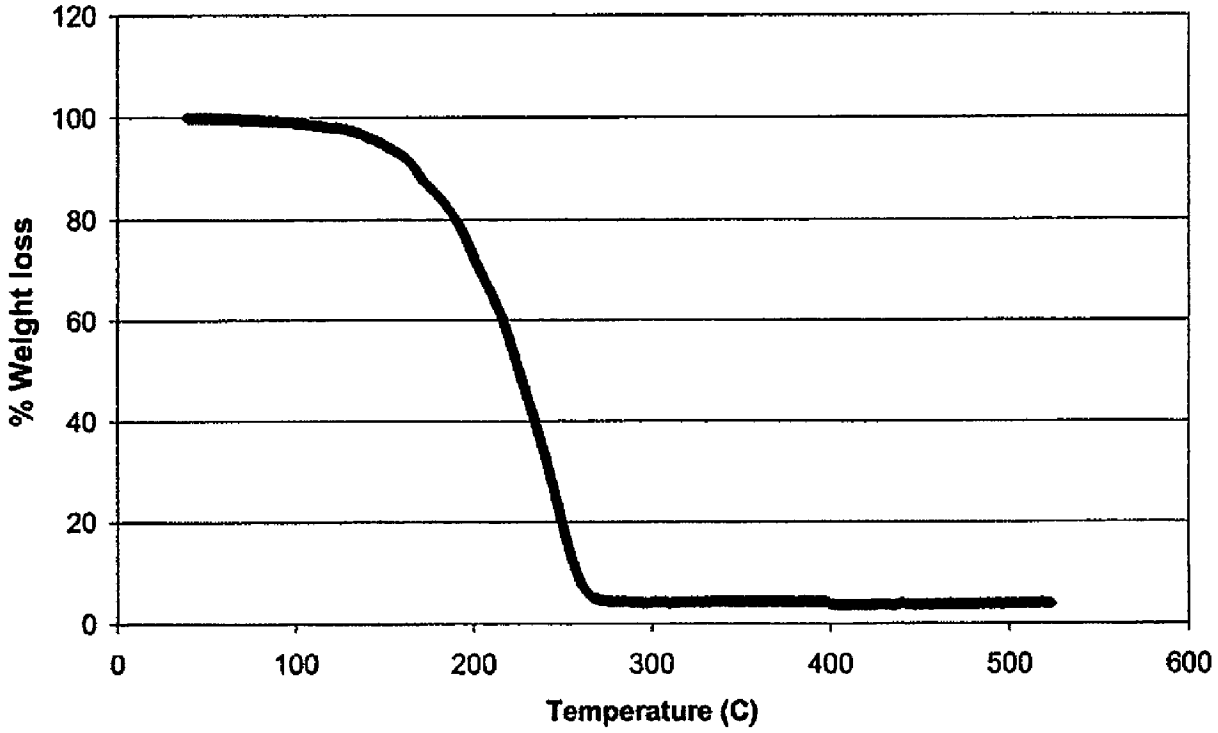
FIG. 5 is a graphical representation of TGA data demonstrating % weight loss vs. temperature of $(MeCp)Ti(OMe)_3$.

FIG. 5 represents TGA data for $(MeCp)Ti(OMe)_3$.

Figure 9:
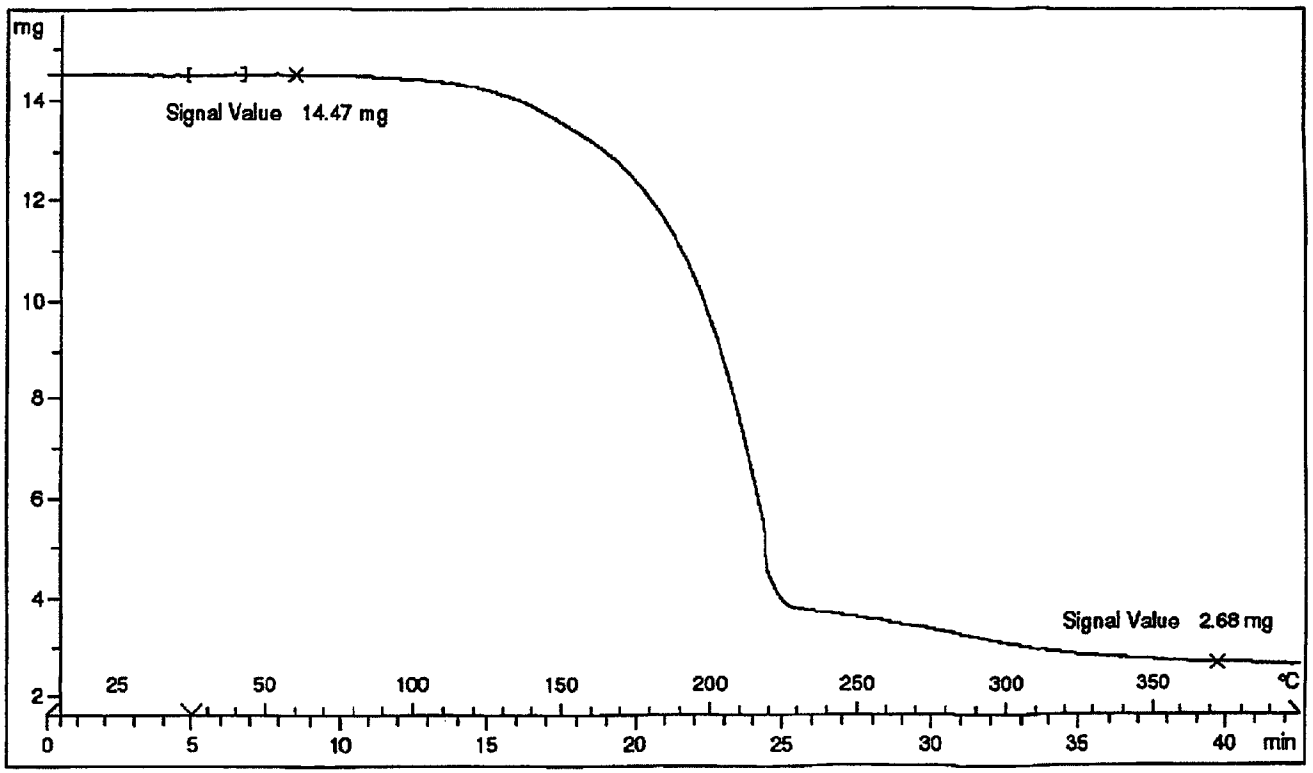
FIG. 9 is a graphical representation of TGA data demonstrating mg vs. temperature/time of $(MeCp)Ti(NMe_2)_3$.

FIG. 9 represents TGA data for $(MeCp)Ti(NMe_2)_3$.

Figure 10:
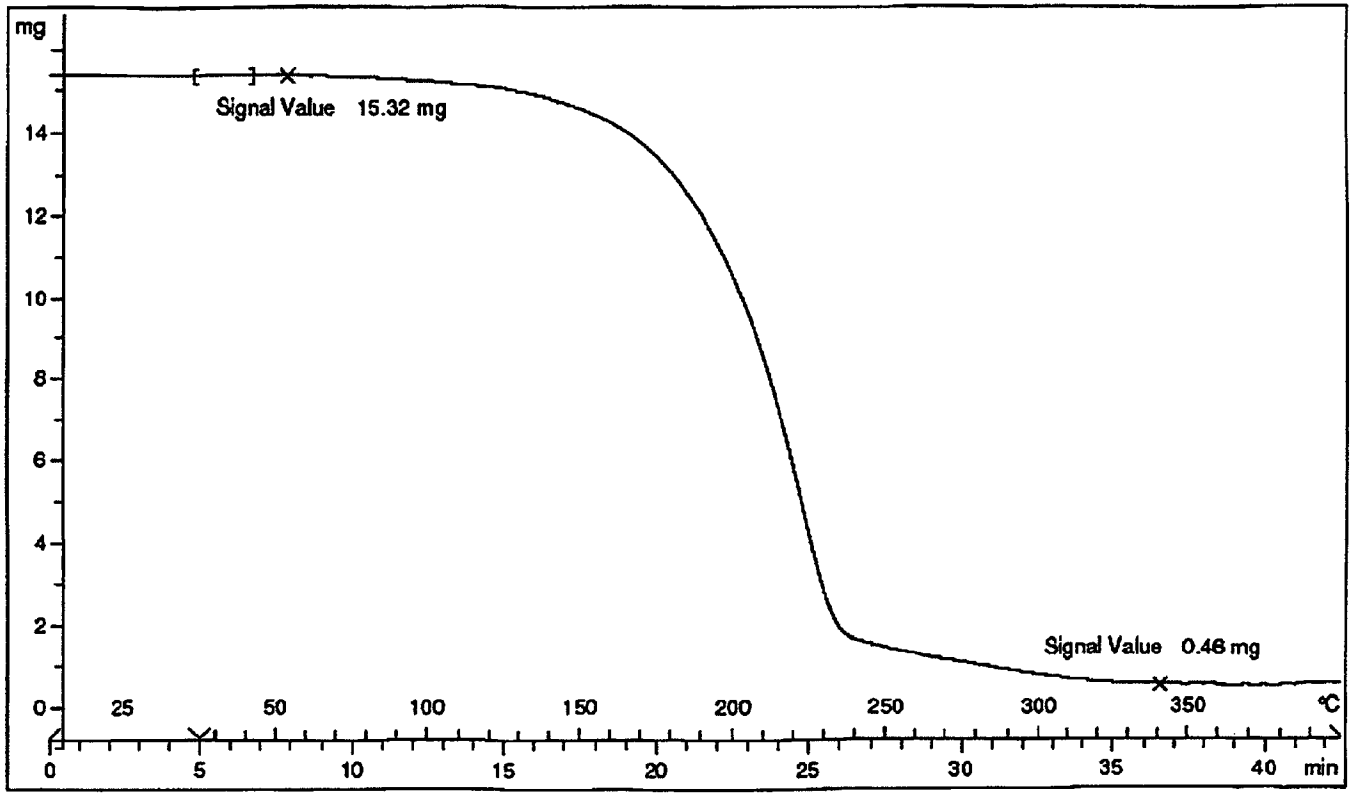
FIG. 10 is a graphical representation of TGA data demonstrating mg vs. temperature/time of $(MeCp)Ti(OtBu)_3$.

FIG. 10 represents TGA data for $(MeCp)Ti(OtBu)_3$.

Figure 13:
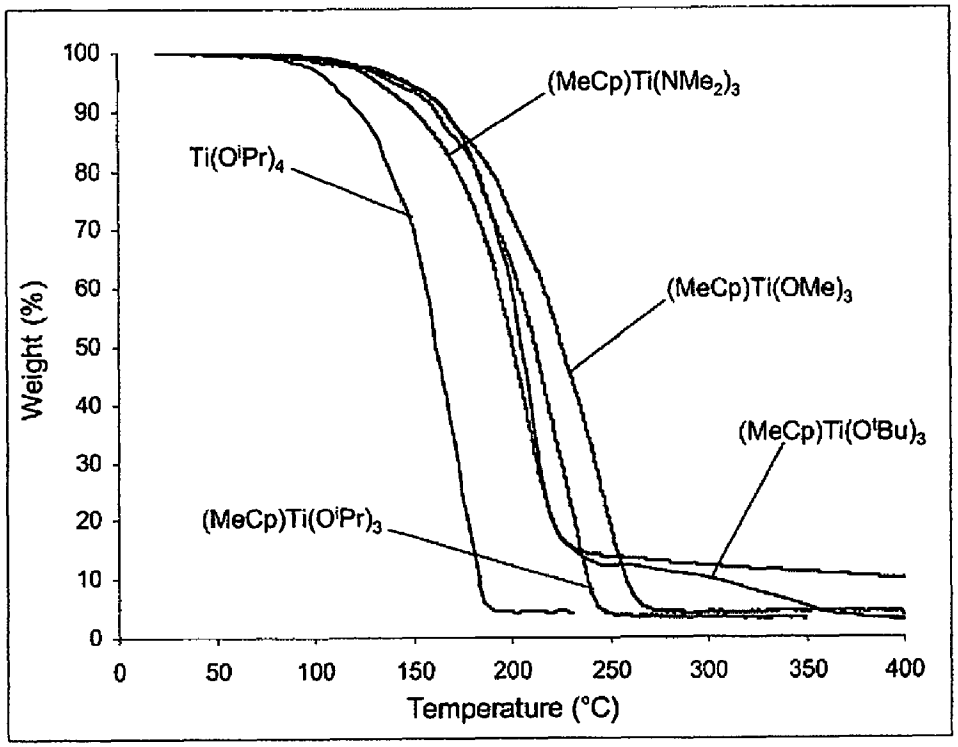
FIG. 13 is a graphical representation a TGA comparison of $(MeCp)Ti(OiPr)_3$, $(MeCp)Ti(OMe)_3$, $(MeCp)Ti(NMe_2)_3$ and $(MeCp)Ti(OtBu)_3$ to $Ti(OiPr)_4$ standard precursor.

FIG. 13 represents a TGA comparison of $(MeCp)Ti(OiPr)_3$, $(MeCp)Ti(OMe)_3$, $(MeCp)Ti(NMe_2)_3$ and $(MeCp)Ti(OtBu)_3$ to $Ti(OiPr)_4$ standard precursor.

The vaporization characteristics of the optimized new sources are clearly demonstrated as superior to the conventional titanium source with reduced residues at higher temperatures. The ability to access higher growth temperatures without premature decomposition is of great benefit to ALD process, especially at larger batch sizes where uniformity of film thicknesses over large areas is critical.

Example 8

ALD of $(MeCp)Ti(OiPr)_3$

Titanium oxide thin films were deposited in a custom-built ALD reactor. $(MeCp)Ti(OiPr)_3$ and ozone were used as precursors. The titanium oxide films were deposited on silicon wafer substrates. Prior to deposition, the wafer substrates were prepared by dicing the wafer (1 inch×½ inch), and 1% HF polished.

The growth temperature was 200-350° C. The growth pressure was 0.5-1.5 Torr. The reactor was continuously purged with 30 sccm of dry nitrogen. All the computer controlled valves in the reactor were the air operated ALD VCR valves from Cajon.

Ozone was purged in excess. The titanium was stored in a stainless steel ampoule. Attached directly to the ampoule was an ALD valve. The output of this ALD valve was Tee'd with another ALD valve used for nitrogen injection. The Tee outlet leg was connected to a 500 $cm^3$ stainless steel reservoir. The outlet of the reservoir was attached to a third ALD valve, called the inject valve, whose outlet goes directly to the reactor. Nitrogen injection was used to build up the total pressure behind the titanium inject valve so that the pressure was higher than the reactor growth pressure. The injected nitrogen was accomplished using a 30 micron pin hole VCR gasket. All of the valves and ampoule were placed into an oven-like enclosure that allowed the ampoule, valves, and tubing to be heated uniformly to 50° C. to 250° C.

During the ALD growth operation, the valves were sequenced in the following manner. The titanium precursor was introduced to the activated silicon surface. A nitrogen purge then took place which included evacuation to remove surplus reactant molecules not attached to the surface. Ozone was then introduced as a co-reactant species, followed by an additional purge with nitrogen. The ozone was then injected to start the ALD cycle all over again.

The total amount of cycles was from 100 to 400, typically 300. Results showed that the deposition rate was independent of the titanium dose as varied through its vapor pressure, which in turn was varied through its evaporation temperature. This proves that the film growth proceeded in a self-limiting manner as is characteristic of ALD.

FIG. 7 demonstrates ALD growth data of $(MeCp)Ti(OiPr)_3$ in comparison with two standard precursors, i.e. $Ti(OiPr)_4$ and $Ti(Me_2)_4$.

Figure 8:
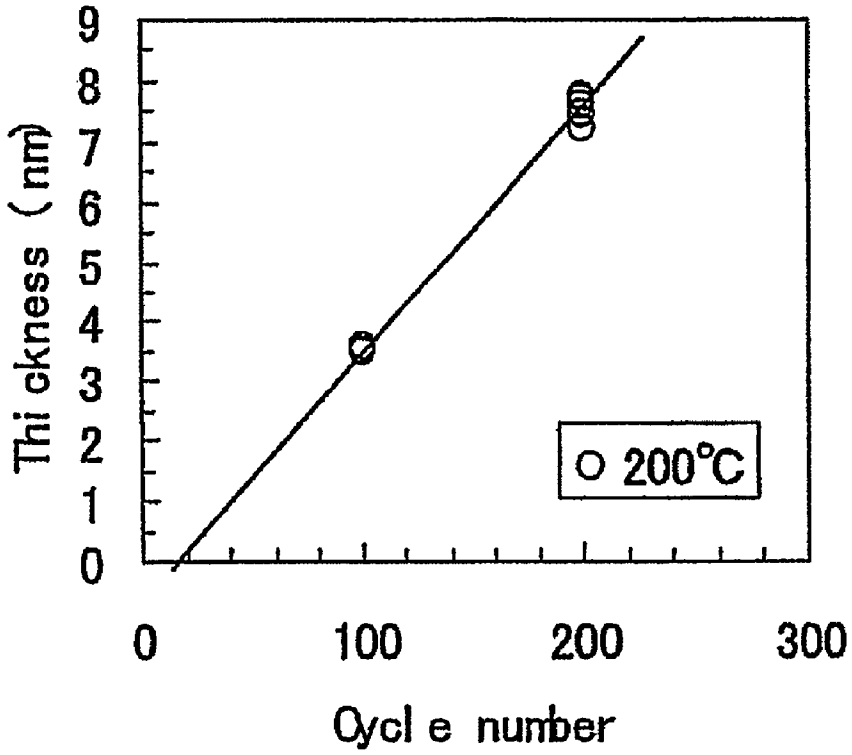
FIG. 8 is a graphical representation demonstrating increase in thickness with number of cycles which demonstrates the ALD behavior of $(MeCp)Ti(OiPr)_3$ at 200° C.

FIG. 8 demonstrates increase in thickness with number of cycles which demonstrates the ALD behavior of $(MeCp)Ti(OiPr)_3$ at 200° C.

Figure 8A:
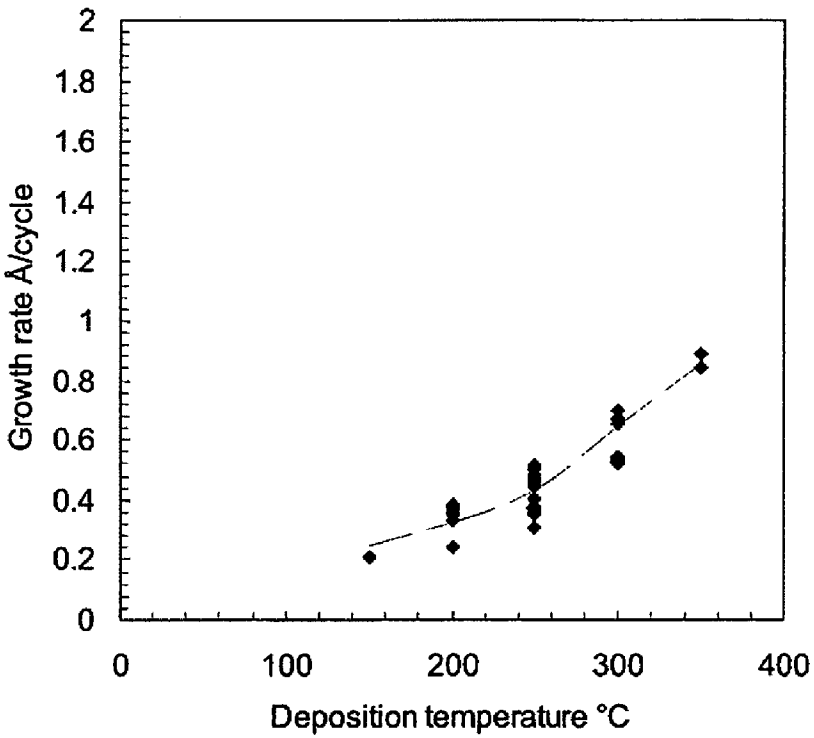
FIG. 8A is a graphical representation demonstrating growth rate versus deposition temperature for ALD of $(MeCp)Ti(OiPr)_3$.

FIG. 8A demonstrates growth rate versus deposition temperature for ALD of $(MeCp)Ti(OiPr)_3$. The growth rate at 200° C. was about 0.35 Å/cycle.

Example 9

ALD of $(MeCp)Ti(NMe_2)_3$

The procedure used in Example 5 was used to perform ALD using $(MeCp)Ti(NMe_2)_3$.

Figure 14:
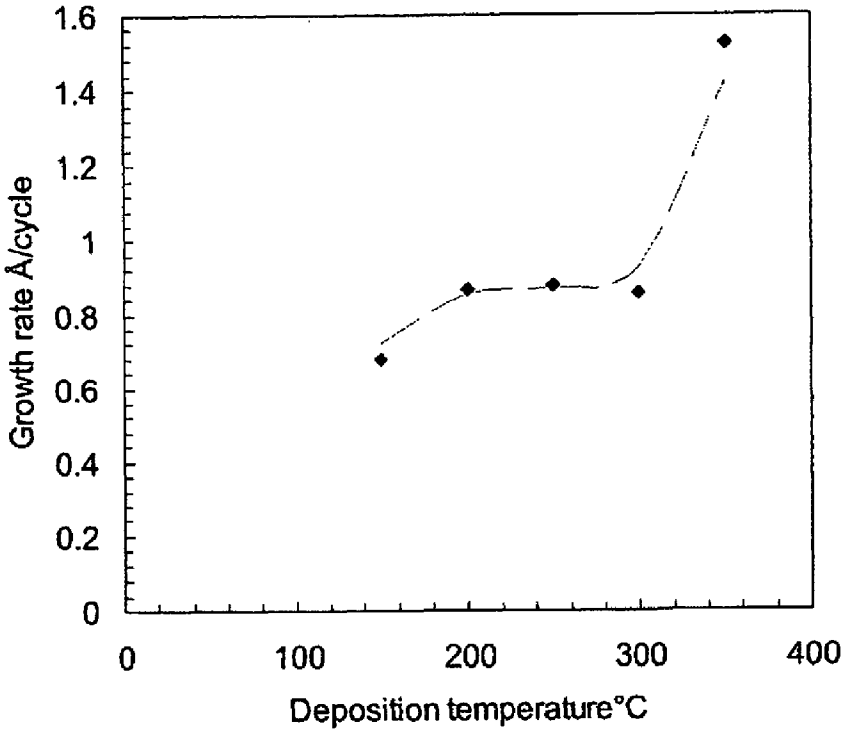
FIG. 14 is a graphical representation of growth rate versus deposition temperature for ALD of $(MeCp)Ti(NMe_2)_3$.

FIG. 14 demonstrates growth rate versus deposition temperature for ALD of $(MeCp)Ti(NMe_2)_3$. The growth rate at 200° C. was about 0.87 Å/cycle.

Figure 15:
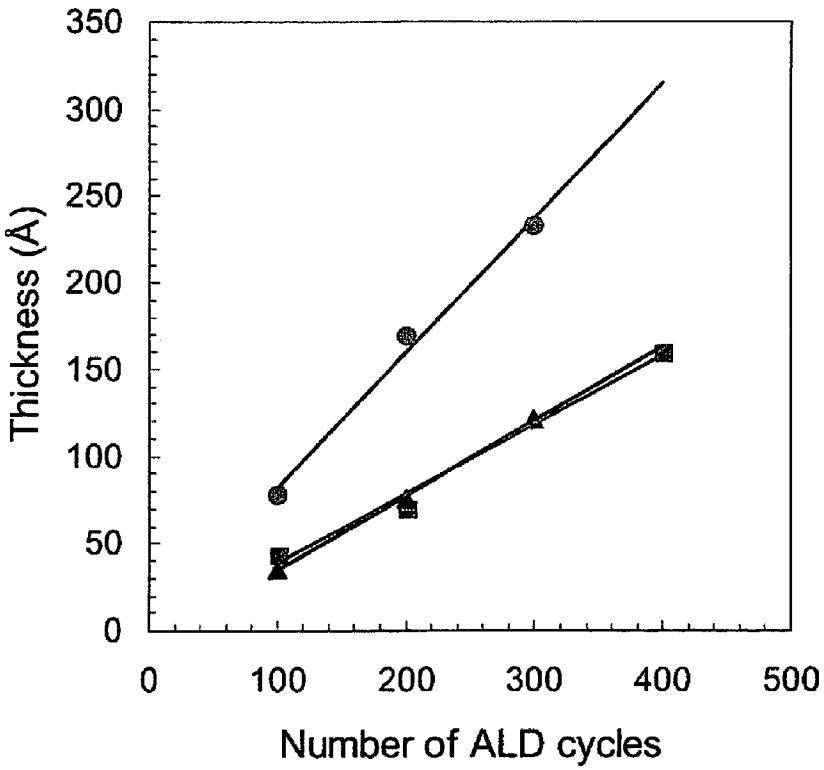
FIG. 15 is a graphical representation of the dependence of $TiO_2$ thickness on number of cycles at 200° C. for $(MeCp)Ti(OiPr)_3$ (represented by the line with triangular points) and $(MeCp)Ti(NMe_2)_3$ (represented by the line with circular points) in comparison to $Ti(OiPr)_4$ standard precursor (represented by the line with square points).

FIG. 15 demonstrates the dependence of $TiO_2$ thickness on number of cycles at 200° C. for $(MeCp)Ti(OiPr)_3$ and $(MeCp)Ti(NMe_2)_3$ in comparison to $Ti(OiPr)_4$ standard precursor.

Example 10

SIMS Analysis of $TiO_2$ from $(MeCp)Ti(OiPr)_3$

Figure 16A:
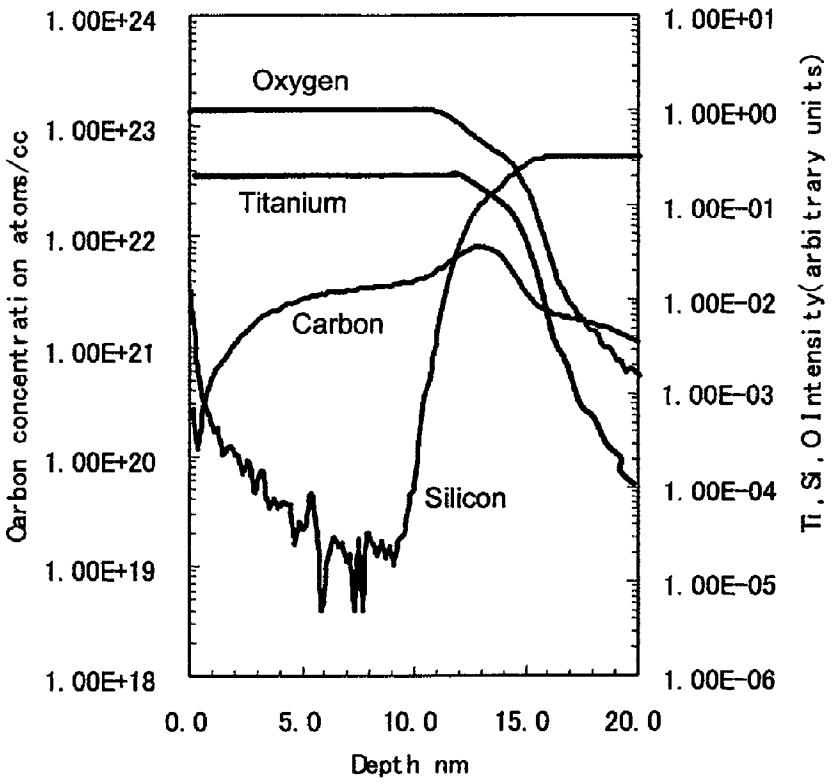
FIG. 16A is a graphical representation of Secondary-Ion Mass Spectrometry (SIMS) analysis performed of a layer of $TiO_2$ grown at 200° C. from $(MeCp)Ti(OiPr)_3$.
Figure 16B:
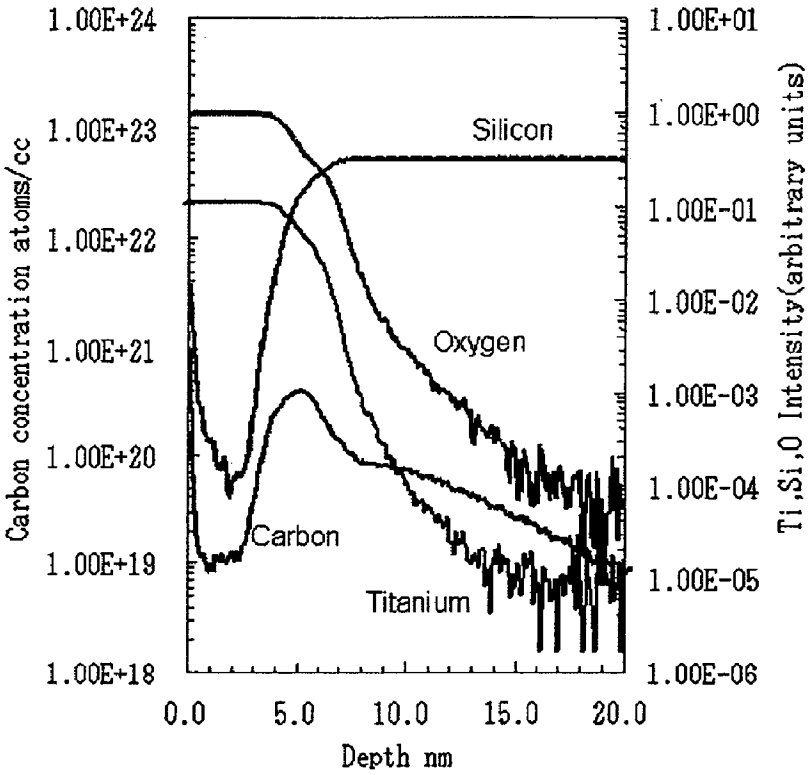
FIG. 16B is a graphical representation of SIMS analysis performed of a layer of $TiO_2$ grown at 300° C. from $(MeCp)Ti(OiPr)_3$.

FIGS. 16A and 16B represent SIMS analysis performed of $TiO_2$ from $(MeCp)Ti(OiPr)_3$. FIG. 16A represents a layer grown at 200° C. and FIG. 16B represents a layer grown at 300° C.

In both cases the Ti:O ratio in the deposited layer is stoichiometric. At the lower growth temperature the carbon background is high but at 300° C. this has been significantly reduced. Indeed the carbon level at the same growth temperature for the conventional $Ti(OiPr)_4$ remains much higher ($10^{20}$ cf $10^{19}$) highlighting the cleaner organic material removal from the surface reactions achieved using the new sources.

Example 11

SIMS Analysis of $TiO_2$ from $(MeCp)Ti(NMe_2)_3$

Figure 17A:
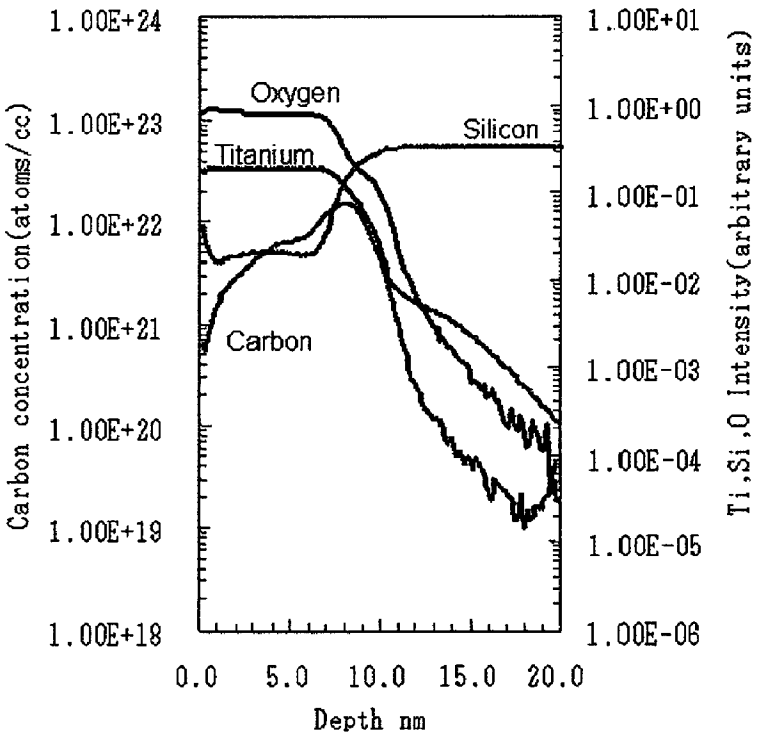
FIG. 17A is a graphical representation of SIMS analysis performed of a layer of $TiO_2$ grown at 200° C. from $(MeCp)Ti(NMe_2)_3$.
Figure 17B:
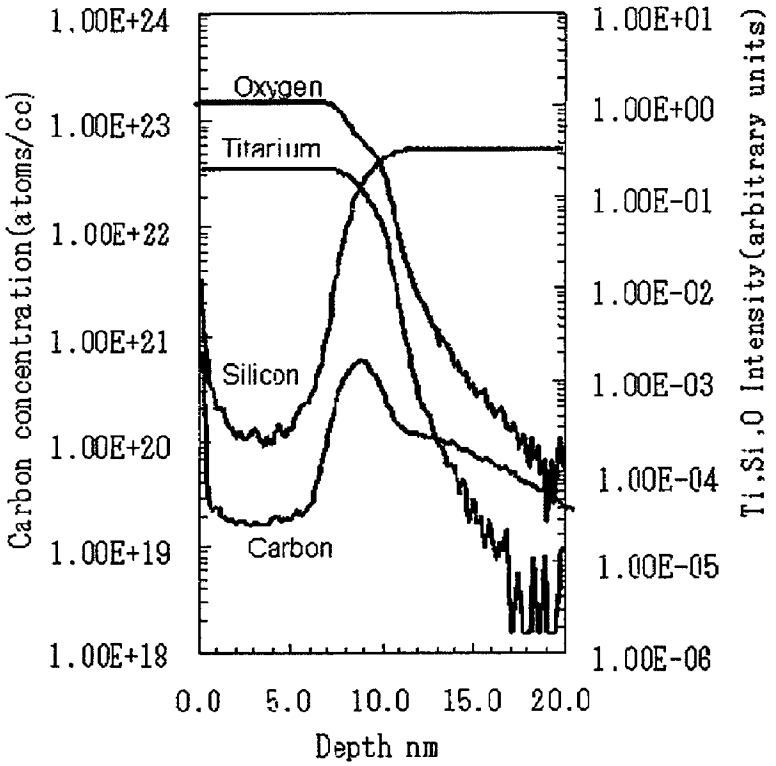
FIG. 17B is a graphical representation of SIMS analysis performed of a layer of $TiO_2$ grown at 300° C. from (MeCp) $Ti(NMe_2)_3$.

FIGS. 17A and 17B represent SIMS analysis performed of $TiO_2$ from $(MeCp)Ti(NMe_2)_3$. FIG. 17A represents a layer grown at 200° C. and FIG. 17B represents a layer grown at 300° C.

As for the $(MeCp)Ti(OiPr)_3$ the results highlight the much reduced carbon contamination of deposited films.

All patents and publications cited herein are incorporated by reference into this application in their entirety.

The words "comprise", "comprises", and "comprising" are to be interpreted inclusively rather than exclusively.

What is claimed is:

1. A method of forming a titanium-containing film by atomic layer deposition, the method comprising delivering at least one precursor to a substrate, wherein the at least one precursor corresponds in structure to Formula [I] *II*:

(Formula I*I*)

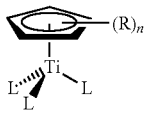

wherein:

R is $C_1$-$C_6$-alkyl;

n is 1, 2, 3[,] *or* 4 [or 5]; *and*

L is $C_1$-$C_6$-alkoxy [or amino, wherein the amino is optionally independently substituted 1 or 2 times with $C_1$-$C_6$-alkyl].

2. The method of claim 1, wherein

R is methyl, ethyl or propyl;

n is 1 or 2; and

L is selected from the group consisting of methoxy, ethoxy, propoxy[,] *and* butoxy[, dimethylamino, ethylmethylamino, and diethylamino].

3. The method of claim 1, wherein

R is methyl or ethyl;

n is 1 or 2; and

L is selected from the group consisting of methoxy, ethoxy, propoxy, and butoxy.

4. The method of claim 1, wherein

R is methyl or ethyl;

n is 1; and

L is selected from the group consisting of methoxy, ethoxy, propoxy and butoxy.

[5. The method of claim 1, wherein

R is methyl or ethyl;

n is 1 or 2; and

L is selected from the group consisting of dimethylamino, ethylmethylamino, and diethylamino.]

6. The method of claim 1, wherein the compound of Formula [(I)] *II* is selected from the group consisting of:

[(methylcyclopentadienyl)$Ti(NMe_2)_3$;

(ethylcyclopentadienyl)$Ti(NMe_2)_3$;

(propylcyclopentadienyl)$Ti(NMe_2)_3$;

(methylcyclopentadienyl)$Ti(NEt_2)_3$;

(ethylcyclopentadienyl)$Ti(NEt_2)_3$;

(propylcyclopentadienyl)$Ti(NEt_2)_3$;

(methylcyclopentadienyl)$Ti(NMeEt)_3$;

(ethylcyclopentadienyl)$Ti(NMeEt)_3$;

(propylcyclopentadienyl)$Ti(NMeEt)_3$;]

(methylcyclopentadienyl)$Ti(OMe)_3$;

(ethylcyclopentadienyl)$Ti(OMe)_3$;

(propylcyclopentadienyl)$Ti(OMe)_3$;

(methylcyclopentadienyl)$Ti(OEt)_3$;

(ethylcyclopentadienyl)$Ti(OEt)_3$;

(propylcyclopentadienyl)$Ti(OEt)_3$;

(methylcyclopentadienyl)$Ti(OiPr)_3$;

(ethylcyclopentadienyl)$Ti(OiPr)_3$;

(propylcyclopentadienyl)$Ti(OiPr)_3$;

(methylcyclopentadienyl)$Ti(OtBu)_3$;

(ethylcyclopentadienyl)$Ti(OtBu)_3$; and (propylcyclopentadienyl)$Ti(OtBu)_3$.

7. The method of claim 1, wherein the compound of Formula [(I)] *II* is selected from the group consisting of:

[(methylcyclopentadienyl)Ti($NMe_2$)$_3$;]

(methylcyclopentadienyl)Ti(OMe)$_3$;

(methylcyclopentadienyl)Ti(OiPr)$_3$; and (methylcyclopentadienyl)Ti(OtBu)$_3$.

8. The method of claim 1, wherein the atomic layer deposition comprises photo-assisted atomic layer deposition.

9. The method of claim 1, wherein the atomic layer deposition comprises liquid injection atomic layer deposition.

10. The method of claim 1, wherein the at least one precursor is delivered to the substrate in pulses alternating with pulses of an oxygen source.

11. The method of claim 10, wherein the oxygen source is selected from $H_2O$, $O_2$ or ozone.

12. The method of claim 1, further comprising delivering to the substrate at least one co-reactant selected from the group consisting of hydrogen, hydrogen plasma, oxygen, air, water, ammonia, hydrazines, alkylhydrazines, boranes, silanes, ozone and a combination thereof.

13. The method of claim 1, wherein at least two precursors corresponding in structure to Formula [I] *II* are delivered to the substrate to form a titanium-containing film by atomic layer deposition.

14. The method of claim 1, further comprising delivering to the substrate at least one non-titanium precursor to form a mixed metal film by atomic layer deposition.

15. The method of claim 14, wherein the mixed metal film formed is selected from the group consisting of strontium titanate, barium titanate, hafnium titanate, zirconium titanate and lead zirconate titanate.

16. The method of claim 1, wherein the titanium-containing film is used for a memory and/or logic application.

*17. The method of claim 1, wherein the substrate is silicon, silicon oxide, silicon nitride, tantalum, tantalum nitride, or copper.*

*18. A method of forming a titanium-containing film by atomic layer deposition, the method comprising delivering at least one precursor to a substrate, wherein the at least one precursor corresponds in structure to Formula III:*

*(Formula III)*

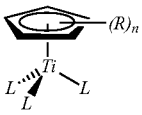

*wherein:*

*R is $C_1$-$C_6$-alkyl;*

*n is 1, 2, 3, 4 or 5; and*

*L is amino, wherein the amino is optionally independently substituted 1 or 2 times with $C_1$-$C_6$-alkyl.*

*19. The method of claim 18, wherein*

*R is methyl, ethyl or propyl;*

*n is 1 or 2; and*

*L is selected from the group consisting of dimethylamino, ethylmethylamino, and diethylamino.*

*20. The method of claim 18, wherein*

*R is methyl or ethyl;*

*n is 1 or 2; and*

*L is selected from the group consisting of dimethylamino, ethylmethylamino, and diethylamino.*

*21. The method of claim 18, wherein the compound of Formula III is selected from the group consisting of:*

*(methylcyclopentadienyl)Ti($NMe_2$)$_3$;*

*(ethylcyclopentadienyl)Ti($NMe_2$)$_3$;*

*(propylcyclopentadienyl)Ti($NMe_2$)$_3$;*

*(methylcyclopentadienyl)Ti($NEt_2$)$_3$;*

*(ethylcyclopentadienyl)Ti($NEt_2$)$_3$;*

*(propylcyclopentadienyl)Ti($NEt_2$)$_3$;*

*(methylcyclopentadienyl)Ti(NMeEt)$_3$;*

*(ethylcyclopentadienyl)Ti(NMeEt)$_3$; and*

*(propylcyclopentadienyl)Ti(NMeEt)$_3$.*

*22. The method of claim 18, wherein the compound of Formula III is methylcyclopentadienyl)Ti($NMe_2$)$_3$.*

*23. The method of claim 18, wherein the atomic layer deposition comprises photo-assisted atomic layer deposition.*

*24. The method of claim 18, wherein the atomic layer deposition comprises liquid injection atomic layer deposition.*

*25. The method of claim 18, wherein the at least one precursor is delivered to the substrate in pulses alternating with pulses of an oxygen source.*

*26. The method of claim 25, wherein the oxygen source is selected from $H_2O$, $O_2$ or ozone.*

*27. The method of claim 18, further comprising delivering to the substrate at least one co-reactant selected from the group consisting of hydrogen, hydrogen plasma, oxygen, air, water, ammonia, hydrazines, alkylhydrazines, boranes, silanes, ozone and a combination thereof.*

*28. The method of claim 18, wherein at least two precursors corresponding in structure to Formula III are delivered to the substrate to form a titanium-containing film by atomic layer deposition.*

*29. The method of claim 18, further comprising delivering to the substrate at least one non-titanium precursor to form a mixed metal film by atomic layer deposition.*

*30. The method of claim 29, wherein the mixed metal film formed is selected from the group consisting of strontium titanate, barium titanate, hafnium titanate, zirconium titanate and lead zirconate titanate.*

*31. The method of claim 18, wherein the titanium-containing film is used for a memory and/or logic application.*

*32. The method of claim 18, wherein the substrate is silicon, silicon oxide, silicon nitride, tantalum, tantalum nitride, or copper.*

* * * * *